United States Patent
Bancod et al.

(10) Patent No.: US 6,847,099 B1
(45) Date of Patent: Jan. 25, 2005

(54) OFFSET ETCHED CORNER LEADS FOR SEMICONDUCTOR PACKAGE

(75) Inventors: Ludovico Bancod, Chandler, AZ (US); Gregorio G. Dela Cruz, San Pedro (PH); Fidelyn R. Canoy, Las Pinas (PH); Leocadio M. Alabin, Sta Rosa (PH)

(73) Assignee: Amkor Technology Inc., Chandler, AZ (US)

( * ) Notice: Subject to any disclaimer, the term of this patent is extended or adjusted under 35 U.S.C. 154(b) by 85 days.

(21) Appl. No.: 10/358,621

(22) Filed: Feb. 5, 2003

(51) Int. Cl.⁷ .......................................... H01L 23/495
(52) U.S. Cl. ......................................................... 257/666
(58) Field of Search ................................ 257/666, 670, 257/676

(56) References Cited

U.S. PATENT DOCUMENTS

| | | | | |
|---|---|---|---|---|
| 4,496,965 A | * | 1/1985 | Orcutt et al. | 257/666 |
| 5,763,942 A | * | 6/1998 | Suzuki | 257/669 |
| 5,951,120 A | * | 9/1999 | Shimura et al. | 303/122.05 |

FOREIGN PATENT DOCUMENTS

| | | |
|---|---|---|
| DE | 19734794 A1 | 8/1997 |
| EP | 54021117 | 6/1979 |
| EP | 59050939 | 3/1984 |
| EP | 0720225 | 3/1996 |
| EP | 0720234 | 3/1996 |
| EP | 0794572 A2 | 10/1997 |
| EP | 0844665 | 5/1998 |
| EP | 0936071 | 8/1999 |
| EP | 0989608 | 3/2000 |
| EP | 1032037 | 8/2000 |
| JP | 55163858 | 12/1980 |
| JP | 5745959 | 3/1982 |
| JP | 58160095 | 8/1983 |
| JP | 159208756 | 11/1984 |
| JP | 59227143 | 12/1984 |
| JP | 60010756 | 1/1985 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |

(List continued on next page.)

OTHER PUBLICATIONS

Mannion, P. "MOSFET's Break Out of the Shackles of Wirebonding", Electronic Design, vol. 47, #6 (Mar. 22, 1999).

National Semiconductor Application Note 1187. "Leadless Leadframe Package (LLP)", Oct. 2002, http://www.

Vishay Siliconx Press Release. http://www.

*Primary Examiner*—David A. Zarneke
(74) *Attorney, Agent, or Firm*—Stetina Brunda Garred & Brucker (57) ABSTRACT

A semiconductor package comprising a leadframe. The leadframe itself comprises an outer frame portion which defines a central opening. Disposed within the central opening is a die pad which defines opposed, generally planar top and bottom die pad surfaces and a peripheral edge. Connected to and extending between the outer frame portion and the peripheral edge of the die pad is at least one tie bar of the leadframe. The leadframe also includes a plurality of leads which are connected to the outer frame portion and extend into the opening at least partially about the die pad in spaced relation to the peripheral edge thereof. Each of the leads includes opposed, generally planar top and bottom lead surfaces, with at least two of the leads comprising corner leads which extend along opposed sides of the tie bar. Each of the corner leads further defines an angularly offset distal portion which extends along and in spaced relation to the tie bar.

21 Claims, 3 Drawing Sheets

FOREIGN PATENT DOCUMENTS

| | | |
|---|---:|---:|
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 884634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150765 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

* cited by examiner

OFFSET ETCHED CORNER LEADS FOR SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages and, more particularly, to a semiconductor package which includes offset etched corner leads to allow etching beyond a minimum capable distance between the die pad tie bars and adjacent lands, or leads which are etched in a manner allowing for an increase in the size of the die pad.

2. Description of the Related Art

The current trend in the electronics industry is to provide electronic devices which are multi-functional, compact, and capable of achieving high performance levels. In view of this trend, a requirement has arisen that the semiconductor packages which are used in such electronic devices be made in a "chip size". These chip-size semiconductor packages are usable in portable products such as cellular phones and PDA's which require high levels of reliability, electrical efficiency, and a small or compact size of minimal weight.

Chip-size semiconductor packages as currently known in the electrical arts typically include a leadframe, and are fabricated in a manner wherein a plurality of input/output signal lands are formed at the peripheral edge of the bottom surface of the package. The package is electrically connected to an underlying substrate such as a printed circuit board (PCB) by soldering the lands on the bottom surface of the package to corresponding pads of the board. In addition to including leads which define the signal lands at the periphery of the bottom surface of the package, the leadframe also includes a semiconductor mounting paddle or pad, the bottom surface of which is also exposed within the package for purposes of maximizing an emission rate of heat generated by the semiconductor die mounted to the top surface thereof.

Internal to such semiconductor package is a semiconductor die having a multitude of input/output pads or terminals. Such terminals are in turn electrically connected to respective leads of the leadframe which, as indicated above, define respective ones of the signal lands. In an often used methodology for fabricating a plurality of the above-described semiconductor packages, a matrix of interconnected leadframes are etched into a leadframe strip. Subsequent to the attachment of the semiconductor dies to respective ones of the die pads and electrical connection of the terminals of the dies to respective ones of the leads, an encapsulation step facilitates the application of an encapsulant material onto the surface of the leadframe strip to which the dies are attached. This encapsulation step covers the dies, the side surfaces of the die pads, and portions of the leads within a single block of encapsulant material. The encapsulant material is then hardened, with a cutting step thereafter being used to separate individual semiconductor packages from each other and from the disposable portions of each of the leadframes within the leadframe strip. The cutting step severs the connection between each of the interconnected leadframes within the leadframe strip, and the die pad and leads of each individual leadframe. This cutting or "singulation" process is typically accomplished through either a sawing process (saw singulation) or a punching process (punch singulation). The formation of the individual leadframes within the leadframe strip is itself typically accomplished through either a chemical etching or mechanical stamping process.

An overall limitation of the design of the above-described semiconductor package pertains to the electrical connections and configurations utilized to satisfy the required electrical inputs and outputs to and from the input/output terminals of the semiconductor die. In this regard, the satisfaction of current functionality requirements typically necessitates the highest possible lead count for the semiconductor package. Those leads of each leadframe disposed adjacent to the tie bar(s) extending to the die pad are typically referred to as corner leads, and are those which are typically the least reliable due to their reduced land length attributable to the required spatial separation between such corner leads and the corresponding tie bar. The present invention addresses this reliability issue by providing a leadframe which includes purposely offset etched corner leads which allow for etching beyond a minimum capable distance between the tie bar and those corner leads adjacent thereto. The resultant added length to the lands defined by these corner leads provides a highest lead count semiconductor package with better board level reliability attributable to longer land lengths.

BRIEF SUMMARY OF THE INVENTION

In accordance with the present invention, there is provided a semiconductor package which, in one embodiment of the present invention, includes a leadframe comprising a die pad defining opposed, generally planar top and bottom die pad surfaces and a peripheral edge. Connected to and extending from the peripheral edge of the die pad is at least one tie bar of the leadframe, which also includes a plurality of leads extending at least partially about the die pad in spaced relation to the peripheral edge thereof. Each of the leads includes opposed, generally planar top and bottom lead surfaces, with at least two of the leads comprising corner leads which extend along opposed sides of the tie bar. Each of the corner leads further defines an angularly offset distal portion which extends along and in spaced relation to the tie bar. The distal portion has a top surface which extends in generally co-planar relation to the top lead surface, and a bottom distal surface which is recessed relative to the bottom lead surface.

In an alternative embodiment of the present invention, the leads of the leadframe are identically configured, with each such lead including a recessed lead shelf formed within the top lead surface adjacent the peripheral edge of the die pad. In the alternative embodiment, each of the leads further includes a pair of ear portions extending laterally from respective sides of each of the leads in opposed relation to each other. The ear portions each have a top ear surface which extends in generally co-planar relation to the top lead surface and a bottom ear surface which is recessed relative to the bottom lead surface. The inclusion of the recessed lead shelf within each of the leads of this alternative embodiment allows for an increase in the size of the die pad of the leadframe.

In each embodiment of the present invention, the bottom lead surfaces define lands which are of increased length to provide superior board level reliability. In addition to the increased length lands defined by the leads of the leadframes constructed in accordance with the present invention, the structural attributes of such leadframes also provide any semiconductor package fabricated to include the same with a maximum lead count in addition to the optimum board level reliability attributable to the increased land lengths.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
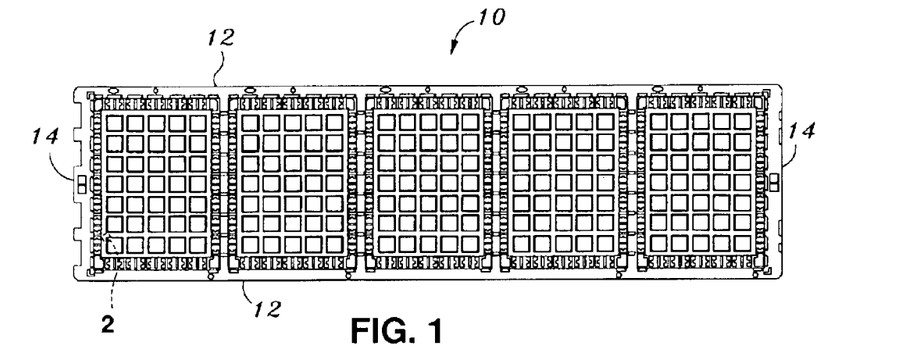
FIG. 1 is a top plan view of a leadframe strip defining multiple leadframes formed in accordance with one embodiment of the present invention.

Referring now to the drawings, FIG. 1 depicts a leadframe strip 10 constructed in accordance with the present invention. The leadframe strip 10 has a generally rectangular configuration, defining an opposed pair of longitudinal peripheral edge segments 12 and an opposed pair of lateral peripheral edge segments 14. The strip 10 defines a multiplicity of identically configured leadframes 16. Those of ordinary skill in the art will recognize that the number and arrangement of the leadframes 16 shown in FIG. 1 are exemplary only, and that the strip 10 may be fabricated to define any number of leadframes 16 arranged in a multiplicity of different configurations or arrays without departing from the spirit and scope of the present invention.

Figure 2:
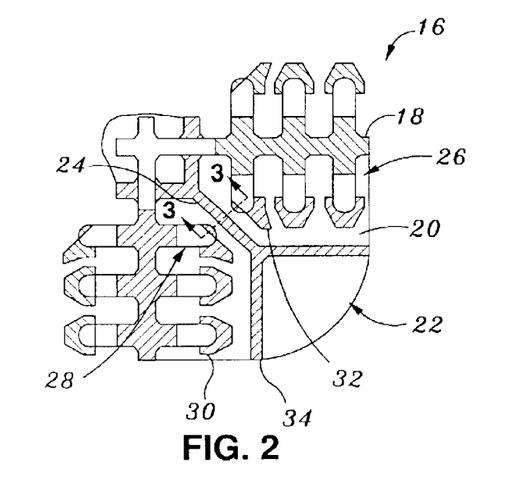
FIG. 2 is an enlargement of the encircled region 2 shown in FIG. 1, depicting a bottom plan view of a portion of one of the leadframes in the leadframe strip.

Referring now to FIG. 2, each leadframe 16 comprises a generally square outer frame portion 18 which defines a centrally positioned, generally square opening 20. Disposed within the opening 20 is a die pad 22 of the leadframe 16. The die pad 22 is a substantially square plate which is connected to the outer frame portion 18 by a plurality of tie bars. 24 of the leadframe 16. Within each leadfrane 16, four tie bars 24 are used to connect the die pad 22 to the outer frame portion 18, with the tie bars 24 extending from respective ones of the four corner regions defined by the die pad 22. The tie bars 24 facilitate the stable support of the die pad 22 inside the outer frame portion 18 and, more particularly, within the opening 20 defined thereby. As indicated above, the opening 20 has a generally square configuration, as does the outer frame portion 18.

Each leadframe 16 further comprises a multiplicity of leads 26 which are integrally connected to the outer frame portion 18 and protrude therefrom into the opening 20 toward the peripheral edge of the die pad 22. The leads 26 are segregated into four sets, with each set being disposed in spaced relation to a respective one of the four peripheral edge segments defined by the die pad 22. The leads 26 of each set are also equidistantly spaced from each other, with narrow gaps of equal width being defined therebetween. As indicated above, the free, distal ends of the leads 26 are disposed in spaced relation to the peripheral edge of the die pad 22.

Figure 3:
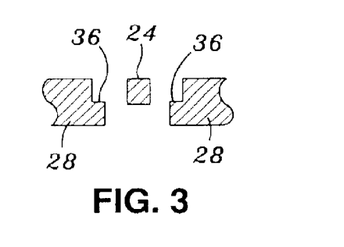
FIG. 3 is a cross-sectional view taken along line 3—3 of FIG. 2.
Figure 4:
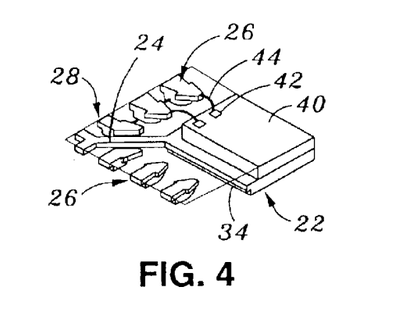
FIG. 4 is a top perspective view of a portion of the leadframe shown in FIG. 2 subsequent to the singulation thereof, further illustrating a semiconductor die mounted to the die pad of the leadframe and electrically connected to the leads thereof.

As shown in FIGS. 2–4, the leadframe 16 is not fabricated to be of uniform thickness. In this regard, the regions of the outer frame portion 18, die pad 22, tie bars 24 and leads 26 represented as hatched lines in FIG. 2 have a thinner thickness than that of the remainder of the leadframe 16. Those leads 26 of each leadframe 16 which are disposed adjacent to a respective one of the tie bars 24 thereof are formed to have structural attributes differing from the remaining leads 26 of the leadframe. For purposes of clarity, the leads 26 of each leadframe 16 which are disposed adjacent to one of the tie bars 24 thereof will be referred to as "corner leads" designated with the reference numeral 28. Each leadframe 16 includes a total of eight corner leads 28, which are segregated into four pairs extending along opposed sides of respective ones of the four tie bars 24.

In the leadframe 16, each of the leads 26 defines an enlarged inner end portion or distal portion 30 having a generally triangular configuration. Additionally, each of the corner leads 28 defines an angularly offset distal portion 32 which extends along and in spaced relation to a respective one of the tie bars 24. As indicated above, the leadframe 16 is not fabricated to be of uniform thickness. In this regard, the die pad 22 is preferably formed in a manner wherein a recessed shoulder or shelf 34 extends about the periphery of the bottom surface of the die pad 22. Additionally, the distal portion 30 of each lead 26 is half-etched so as to be of reduced thickness in comparison to the remainder thereof. In this regard, as is seen in FIGS. 2 and 4, the top surface of the distal portion 30 is substantially flush or continuous with the top surface of the remainder of the corresponding lead 26. However, the bottom surface of the distal portion 30 is laterally offset or recessed relative to the bottom surface of the remainder of the corresponding lead 26. Similarly, the top surface of each distal portion 32 is substantially flush or continuous with the top surface of the remainder of the corresponding corner lead 28. However, the bottom surface of each distal portion 32 is laterally offset or recessed relative to the bottom surface of the remainder of the corresponding corner lead 28.

With particular regard to the corner leads 28, as is seen in FIGS. 2 and 3, the top surface of each corner lead 28 is further formed to include a recessed shoulder or shelf 36 therein which is located adjacent to the corresponding distal portion 32. The inclusion of the shelf 36 within the top surface of each corner lead 28 provides additional clearance between the corner leads 28 of each pair and the corresponding tie bar 24. In this regard, in order to achieve prescribed functionality levels, an adequate clearance between each corner lead 28 and the adjacent tie bar 24 is required, with such clearance being provided by the inclusion of the shelf 36 within the top surface of each corner lead 28 of the pair. As is seen in FIGS. 2–4, each tie bar 24 is itself half-etched in a manner wherein the thickness thereof is approximately half of that of the die pad 22 and substantially equal to that of the half-etched distal portions 30, 32 of the leads 26 and corner leads 28. The reduced thickness of each tie bar 24, coupled with the inclusion of the shelf 36 within the top surface of each of the corner leads 28 of the adjacent, corresponding pair, collectively provides the clearance parameters described above.

Within each leadfrane 16, those portions of the leads 26 and corner leads 28 which are integrally connected to the outer frame portion 18 are also of reduced thickness, as are portions of the outer frame portion 18 itself. In this regard, that portion of each lead 26 integrally connected to the outer frame portion 18 is laterally offset or recessed relative to the bottom surface of the remainder of such lead 26. Similarly, that portion of each corner lead 26 integrally connected to the outer frame portion 18 is laterally offset or recessed relative to the bottom surface of the remainder of such corner lead 28. Thus, in each completely formed leadframe 16, the top surfaces of the leads 26, corner leads 28, distal portions 30, 32, tie bars 24, and die pad 22 extend in generally co-planar relation to each other. Additionally, the shelves 34, 36, bottom surfaces of the distal portions 30, 32 and bottom surfaces of the tie bars 24 extend in generally co-planar relation to each other, with the bottom surfaces of the leads 26, corner leads 28 and die pad 22 themselves extending in generally co-planar relation to each other. The reduced thickness portions of the leads 26 and corner leads 28 integrally connected to the outer frame portion 18 also extend in generally co-planar relation to the bottom surfaces of the distal portions 30, 32 and tie bars 24.

The leadframe strip 10, and hence the individual leadframes 16 defined thereby, is preferably manufactured from a conductive metal material, such as copper, through the use of either a chemical etching or a mechanical stamping process. Chemical etching (also known as chemical milling) is a process that uses photolithography and metal dissolving chemicals to etch a pattern into a metal strip. A photoresist is exposed to ultraviolet light through a photomask having a desired pattern, and is subsequently developed and cured. Chemicals are sprayed or otherwise applied to the masked strip, and exposed portions of the strip are etched away, leaving the desired pattern. Mechanical stamping uses sets of progressive dies to mechanically remove metal from a metal strip. Each of a plurality of stamping stations uses one of the dies to punch a distinct small area of metal from the strip as the strip moves through the stations. The formation of the leadframe 16 within the strip 10 is preferably accomplished through the application of etching chemicals to both sides of the strip 10 as results in each leadframe 16 having the above-described structural attributes and cross-sectional configurations. The strip 10 may be formed by chemically etching rolled strip metal stock from both sides using conventional liquid etchant.

Figure 5:
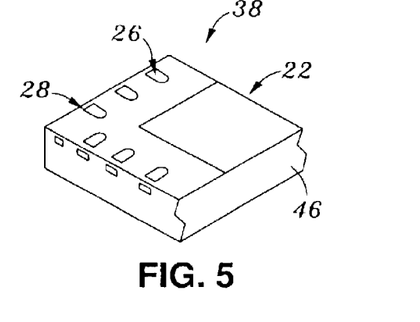
FIG. 5 is a partial, bottom perspective view of a semiconductor package including the leadframe and semiconductor die shown in FIG. 4.

Referring now to FIGS. 4 and 5, each leadframe 16 having the above-described structural characteristics comprises one of the primary components of a semiconductor package 38 which is partially shown in FIG. 5. To facilitate the fabrication of the semiconductor package 38, a semiconductor die 40 having a plurality of input/output terminals 42 disposed on the top surface thereof is itself attached or bonded to the top surface of the die pad 22 of the leadframe 16. Such bonding may be accomplished through the use of an epoxy, an adhesive film, or adhesive tape. The terminals 42 of the die 40 are mechanically and electrically connected to respective ones of the leads 26 and corner leads 28 through the use of conductive wires 44. In FIG. 4, only two exemplary terminals 42 and conductive wires 44 are shown. The conductive wires 44 are preferably used to electrically connect the terminals 42 to respective ones of the distal portions 30 of the leads 26 and to respective ones of the distal portions 32 of the corner leads 28.

In the semiconductor package 38, the die pad 22, the semiconductor die 40, the conductive wires 44, and the leads 26, 28 are each completely or partially covered with a sealing material, such as an epoxy molding compound. The hardened sealing material defines a package body 46 of the semiconductor package 38. As seen in FIG. 5, the sealing material used to form the package body 46 underfills the shelf 34 of the die pad 22, but does not cover the bottom surface thereof. Thus, in the complete semiconductor package 38, the bottom surface of the die pad 22 is exposed within and substantially flush with the bottom surface of the package body 46, thus providing heat dissipation for the semiconductor die 40 mounted to the top surface of the die pad 22. The underfill of the sealing material into the shelf 34 creates a mechanical interlock between the die pad 22 and the package body 46 which prevents any dislodgement of the die pad 22 from the package body 46.

The sealing material used to form the package body 46 also underfills the reduced thickness distal portions 30, 32 of the leads 26, 28, in addition to underfilling the reduced thickness portions of the leads 26, 28 which are integrally connected to the outer frame portion 18 of the leadframe 16. The sealing material further flows into and covers the shelves 36 formed within the corner leads 28. However, the bottom surfaces of the leads 26 and corner leads 28 are not covered by the sealing material, and thus are exposed within and substantially flush with the bottom surface of the package body 46 as shown in FIG. 5. The exposed bottom surfaces of the leads 26 and corner leads 28 define lands for the semiconductor package 38 which are used to facilitate the electrical connection thereof to an underlying substrate such as a printed circuit board.

The complete fabrication of the semiconductor package 38 shown in FIG. 5 requires that the leadframe 16 thereof be "singulated" to facilitate its separation from the other leadframes 16 in the leadframe strip 10. As indicated above, such singulation is typically accomplished via a sawing process or a punching process. As a result of such singulation process, the outer frame portion 18 of the leadframe 16, which is sacrificial, is removed from the remainder of the corresponding semiconductor package 38, as are portions of the leads 26 and corner leads 28 immediately adjacent the outer frame portion 18. In the completed semiconductor package 38, the severed outer ends of the leads 26, corner leads 28 and tie bars 24 are exposed within and substantially flush with respective ones of the four side surfaces defined by the package body 46. As further seen in FIG. 5, a "pullback" is defined between the exposed bottom surface or land of each of the leads 26 and corner leads 28, and the side surfaces of the package body 46. Such pullback is attributable to the flow of the sealing material used to form the package body 46 over those reduced thickness portions of the leads 26 and corner leads 28 originally extending to the outer frame portion 18 of the leadframe 16. As will be recognized, the covering of such surfaces, along with the covering of the recessed bottom surfaces of the distal portions 30, 32, itself creates a superior mechanical interlock between the leads 26, 28 and package body 46 assisting in preventing any dislodgement of the leads 26, 28 therefrom.

Advantageously, in the completed semiconductor package 38, the length of the lands defined by the bottom surfaces of the corner leads 28 is maxinized as a result of the formation of the corner leads 28 to include the angularly offset, half-etched distal portions 32. As indicated above, the conductive wires 44 are attached to the top surfaces of such distal portions 32, and to the top surfaces of the distal portions 30 of the remaining leads 26. The increased length of the lands defined by the corner leads 28 produces superior board level reliability. Additionally, the resultant ability to effectively utilize the corner leads 28 for electrical connection to the terminals 42 of the semiconductor die 40 provides the semiconductor package 38 with a maximum lead count in addition to the optimum board level reliability. The design of the leads 26 and corner leads 28 in the leadframe 16 allows for the use of either a punch or saw singulation process to facilitate the complete formation of each semiconductor package 38. The formation of the pullback feature shown in FIG. 5 is particularly beneficial in relation to the use of the saw singulation process.

Referring now to FIGS. 6–9, there is shown a leadframe 16a which is constructed in accordance with an alternative embodiment of the present invention. The leadframe 16a includes an outer frame portion 18a, a die pad 22a, and tie bars 24a which are structurally identical to their counterparts within the leadframe 16. The leadframe 16a also includes leads 26a and corner leads 28a which, in contrast to the leads 26, 28, are identically configured to each other. The identical configurations of the leads 26a and corner leads 28a also vary from those of the leads 26, 28 in a manner which will be described in more detail below.

Figure 6:
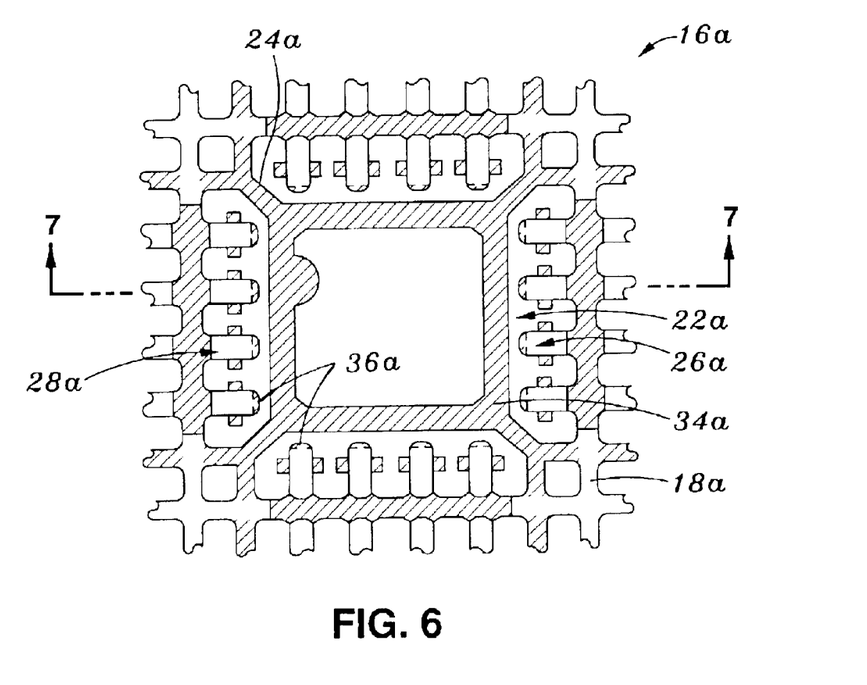
FIG. 6 is a bottom plan view of a leadframe formed in accordance with another embodiment of the present invention.
Figure 7:
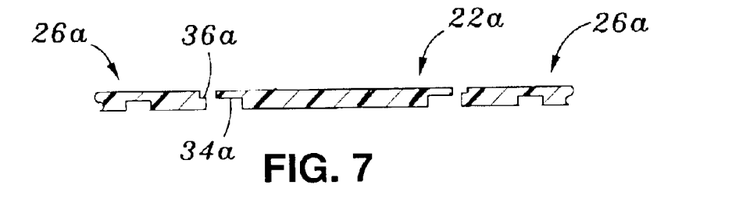
FIG. 7 is a cross-sectional view taken along line 7—7 of FIG. 6.
Figure 8:
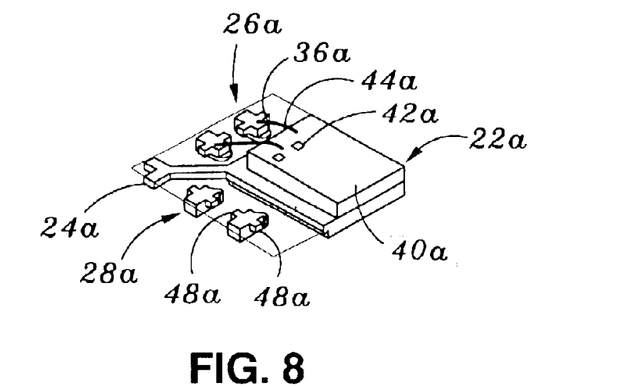
FIG. 8 is a top perspective view of a portion of the leadframe shown in FIG. 6, further illustrating a semiconductor die mounted to the die pad of the leadframe and electrically connected to the leads thereof.

Within the leadframe 16a, each of the leads 26a, 28a includes a shelf 36a formed within the top surface thereof at the distal end which is disposed closest to the peripheral edge of the die pad 22a. Additionally, integrally connected to and extending laterally outward from respective ones of the opposed sides of each of the leads 26a, 28a is a pair of ear portions 48a. The ear portions 48a extend in opposed relation to each other, and include top surfaces which are continuous with the top surface of the remainder of the corresponding lead 26a, 28a. As is seen in FIGS. 6–8, the ear portions 48a of each lead 26a, 28a are of reduced thickness relative to the remainder of such leads 26a, 28a. As such, the bottom surface of each ear portion 48a is laterally offset or recessed relative to the bottom surface of the corresponding lead 26a, 28a. The bottom surfaces of the leads 26a, 28a extend in generally co-planar relation to the bottom surface of the die pad 22a, with the top surfaces of the leads 26a, 28a extending in generally co-planar relation to the top surfaces of the die pad 22a and tie bars 24a. The shelf 36a of each of the leads 26a, 28a extends in generally co-planar relation-to the shelf 34a of the die pad 22a and the bottom surfaces of the tie bars 24a. Each of the leadframes 16a is preferably manufactured in the same manner previously described in relation to the leadframe 16 of the leadframe strip 10.

Figure 9:
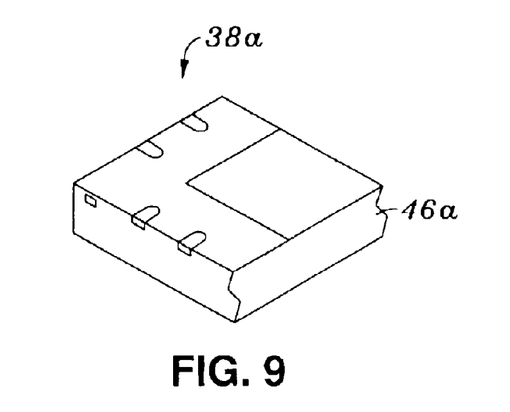
FIG. 9 is a partial, bottom perspective view of a semiconductor package including the leadframe and semiconductor die shown in FIG. 8.

Referring now to FIGS. 8 and 9, each leadframe 16a having the above-described structural characteristics comprises one of the primary components of a semiconductor package 38a which is partially shown in FIG. 9. The semiconductor package 38a includes a semiconductor die 40a which is bonded to the top surface of the die pad 22a and includes input/output terminals 42a which are electrically connected to the top surfaces of respective ones of the leads 26a, 28a via conductive wires 44a. The die pad 22a, semiconductor die 40a, conductive wires 44a and leads 26a, 28a are each completely or partially covered with a sealing material, with the hardening of such sealing material defining the package body 46a of the semiconductor package 38a. The sealing material used to form the package body 46a underfills the shelf 34a of the die pad 22a, but does not cover the bottom surface thereof. Thus, in the complete semiconductor package 38a, the bottom surface of the die pad 22a is exposed within and substantially flush with the bottom surface of the package body 46a, thus providing heat dissipation for the semiconductor die 40a mounted to the top surface of the die pad 22a. The underfill of the sealing material into the shelf 34a creates a mechanical interlock between the die pad 22a and the package body 46a which prevents any dislodgement of the die pad 22a from the package body 46a.

The sealing material used to form the package body 46a also covers the top surfaces and shelves 36a of the leads 26a, 28a, in addition to flowing about and encapsulating the ear portions 48a of each of the leads 26a, 28a. However, the bottom surfaces of the leads 26a, 28a are not covered by the sealing material, and thus are exposed within and substantially flush with the bottom surface of the package body 46a as shown in FIG. 9. The exposed bottom surfaces of the leads 26a and corner leads 28a define lands for the semiconductor package 38a which are used to facilitate the electrical connection thereof to an underlying substrate such as a printed circuit board.

The complete fabrication of the semiconductor package 38a also involves the singulation process described above in relation to the semiconductor package 38. Upon the completion of such singulation process, the severed outer ends of the leads 26a, corner leads 28a and tie bars 24a are exposed within and substantially flush with respective ones of the four side surfaces defined by the package body 46a. The singulation process is completed such that the exposed outer ends of the leads 26a, 28a are not of reduced thickness, thus resulting in the leads 26a, 28a each having a "full lead" configuration, i.e., the bottom surfaces or lands of each of the leads 26a, 28a extend to respective ones of the four side surfaces defined by the package body 46a. Despite the absence of the above-described pullback, inadvertent dislodgement of the leads 26a and corner leads 28a from within the package body 46a is prevented by the mechanical interlock facilitated through the encapsulation of the ear portions 48a of each of the leads 26a, 28a by the package body 46a. The configuration of the leads 26a, 28a in the semiconductor package 38a provide the same benefits and advantages described above in relation to the semiconductor package 38.

As indicated above and as is best seen in FIG. 7, the shelf 36a is formed within the top surface of each of the leads 26a, 28a at the distal end which is disposed closest to the peripheral edge of the die pad 22a. Advantageously, the inclusion of the shelves 36a within the leads 26a, 28a allows for an effective increase in the size of the die pad 22a and, in particular, that portion defining the top surface thereof. As a result, the semiconductor die 40a attached to the top surface of the die pad 22a may be of increased size.

Figure 10:
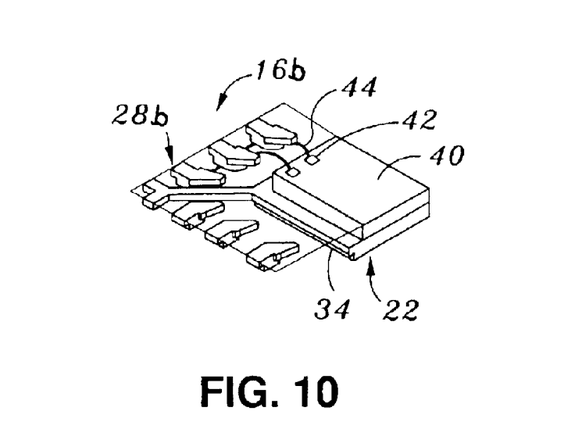
FIG. 10 is a top perspective view of a portion of a leadframe constructed in accordance with another embodiment of the present invention, further illustrating a semiconductor die mounted to the die pad of the leadframe and electrically connected to the leads thereof.

Referring now to FIG. 10, there is shown a top perspective view of a portion of a leadframe 16b constructed in accordance with another embodiment of the present invention.

The leadframe 16b is substantially identical to the above-described leadframe 16, with the only exception being that all of the leads 28b within the leadframe 16b have configurations identical to those of the corner leads 28 of the leadframe 16. In this regard, in contrast to the leads 26 of the leadframe 16 which are configured differently from the corresponding corner leads 28, all of the leads 28b of the leadframe 16b are identically configured, with such configurations themselves being identical to those of the above-described corner leads 28.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A semiconductor package comprising:
   a leadframe comprising:
      a die pad defining opposed, generally planar top and bottom die pad surfaces and a peripheral edge;
      at least one tie bar connected to and extending from the peripheral edge of the die pad;
      a plurality of leads extending at least partially about the die pad in spaced relation to the peripheral edge thereof, the leads each including opposed, generally planar top and bottom lead surfaces, with at least two of the leads comprising corner leads which extend along opposed sides of the tie bar and each further define:
         an angularly offset distal portion extending along and in spaced relation to the tie bar, the distal portion having a top distal surface which extends in generally co-planar relation to the top lead surface and a bottom distal surface which is recessed relative to the bottom lead surface;
   a semiconductor die attached to the top die pad surface and electrically connected to at least one of the leads and at least one of the corner leads; and
   a package body at least partially encapsulating the leadframe and the semiconductor die such that the bottom lead surface of each of the leads and each of the corner leads is exposed within the package body.

2. The semiconductor package of claim 1 wherein:
   the die pad has a generally square configuration defining four corner regions;
   four tie bars are connected to and extend from respective ones of the corner regions of the die pad; and
   the leads include eight corner leads which are segregated into four pairs, the distal portions of the corner leads of each pair extending along and in spaced relation to a respective one of the tie bars.

3. The semiconductor package of claim 1 wherein:
   the die pad includes a recessed die pad shelf which extends along the peripheral edge about the bottom die pad surface; and
   the bottom die pad surface is exposed within the package body.

4. The semiconductor package of claim 1 wherein each of the corner leads further includes a recessed lead shelf formed within the top lead surface adjacent the distal portion, the lead shelf of each of the corner leads being sized and configured to provide a prescribed clearance distance relative to the tie bar.

5. The semiconductor package of claim 4 wherein each of the leads further defines:
   an enlarged inner end portion having a top end surface which extends in generally co-planar relation to the top lead surface and a bottom end surface which is recessed relative to the bottom lead surface.

6. The semiconductor package of claim 5 wherein the inner end portion of each of the leads has a generally triangular configuration.

7. The semiconductor package of claim 5 wherein:
   the tie bar defines opposed, generally planar top and bottom tie bar surfaces; the top die pad surface, the top lead surfaces, the top distal surfaces, and the top tie bar surface extend in generally co-planar relation to each other;
   the bottom die pad surface and the bottom lead surfaces extend in generally co-planar relation to each other; and
   the lead shelves and the bottom distal surfaces of the corner leads and the bottom surface of the tie bar extend in generally co-planar relation to each other.

8. The semiconductor package of claim 7 wherein the die pad includes a recessed die pad shelf which extends along the peripheral edge about the bottom die pad surface in generally co-planar relation to the lead shelves and the bottom distal surfaces of the corner leads and the bottom surface of the tie bar.

9. The semiconductor package of claim 1 wherein:
   each of the leads and each of the corner leads defines an outer end which is exposed within the package body; and
   the outer end of each of the leads and each of the corner leads is separated from the bottom lead surface thereof by a portion of the package body.

10. The semiconductor package of claim 1 wherein the leads and the corner leads are identically configured to each other.

11. A leadframe for use in a semiconductor package, the leadframe comprising:
   an outer frame portion defining a central opening;
   a die pad disposed within the central opening and defining opposed, generally planar top and bottom die pad surfaces and a peripheral edge;
   at least one tie bar connected to and extending between the outer frame portion and the peripheral edge of the die pad; and
   a plurality of leads connected to the outer frame portion and extending into the opening at least partially about the die pad in spaced relation to the peripheral edge thereof, the leads each including opposed, generally planar top and bottom lead surfaces, with at least two of the leads comprising corner leads which extend along opposed sides of the tie bar and each further define:
      an angularly offset distal portion extending along and in spaced relation to the tie bar, the distal portion having a top distal surface which extends in generally co-planar relation to the top lead surface and a bottom distal surface which is recessed relative to the bottom lead surface.

12. The leadframe of claim 11 wherein the die pad includes a recessed die pad shelf which extends along the peripheral edge about the bottom die pad surface.

13. The leadframe of claim 11 wherein each of the corner leads further includes a recessed lead shelf formed within the top lead surface adjacent the distal portion, the lead shelf of each of the corner leads being sized and configured to provide a prescribed clearance distance relative to the tie bar.

14. The leadframe of claim 13 wherein each of the leads further defines:
an enlarged inner end portion having a top end surface which extends in generally co-planar relation to the top lead surface and a bottom end surface which is recessed relative to the bottom lead surface.

15. The leadframe of claim 11 wherein the leads and the corner leads are identically configured to each other.

16. A semiconductor package comprising:
a leadframe comprising:
a die pad;
at least one tie bar connected to and extending from the die pad;
a plurality of leads disposed in spaced relation to the die pad, the leads each including opposed, generally planar top and bottom lead surfaces, with at least one of the leads extending along the tie bar and further defining:
a distal portion extending along and in spaced relation to the tie bar, the distal portion having a top distal surface which extends in generally co-planar relation to the top lead surface and a bottom distal surface which is recessed relative to the bottom lead surface;
a semiconductor die attached to the die pad and electrically connected to at least one of the leads; and
a package body at least partially encapsulating the leadframe and the semiconductor die such that the bottom lead surface of each of the leads is exposed within the package body.

17. The semiconductor package of claim 16 wherein the at least one lead extending along the tie bar includes a recessed lead shelf formed within the top lead surface adjacent to the distal portion, the lead shelf being sized and configured to provide a prescribed clearance distance relative to the tie bar.

18. The semiconductor package of claim 17 wherein each of the leads other than for the at least one lead extending along the tie bar each further define:
an enlarged inner end portion having a top end surface which extends in generally co-planar relation to the top lead surface and a bottom end surface which is recessed relative to the bottom lead surface.

19. The semiconductor package of claim 18 wherein the inner end portion has a generally triangular configuration.

20. A leadframe for use in a semiconductor package, the leadframe comprising:
an outer frame portion defining a central opening;
a die pad disposed within the central opening;
at least one tie bar connected to and extending between the outer frame portion of the die pad; and
a plurality of leads connected to the outer frame and extending into the opening in spaced relation to the die pad, the leads each including opposed, generally planar top and bottom lead surfaces, with at least one of the leads extending along the tie bar and further defining:
a distal portion extending along and in spaced relation to the tie bar, the distal portion having a top distal surface which extends in generally co-planar relation to the top lead surface and a bottom distal surface which is recessed relative to the bottom lead surface.

21. The leadframe of claim 20 wherein the at least one lead extending along the tie bar further includes a recessed lead shelf formed within the top lead surface adjacent the distal portion, the lead shelf being sized and configured to provide a prescribed clearance distance relative to the tie bar.

* * * * *